(12) United States Patent
Shibata

(10) Patent No.: US 7,224,054 B2
(45) Date of Patent: May 29, 2007

(54) SEMICONDUCTOR DEVICE AND SYSTEM HAVING SEMICONDUCTOR DEVICE MOUNTED THEREON

(75) Inventor: Manabu Shibata, Hokkaido (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/385,919

(22) Filed: Mar. 11, 2003

(65) Prior Publication Data

US 2004/0004280 A1 Jan. 8, 2004

(30) Foreign Application Priority Data

Jul. 4, 2002 (JP) ............................. 2002-195650

(51) Int. Cl.
*H01L 23/06* (2006.01)
(52) U.S. Cl. ...................... 257/684; 257/673; 257/686; 257/690; 257/700; 257/750; 257/779
(58) Field of Classification Search ................ 257/667, 257/673, 684–6, 690, 700, 750, 779, 664
See application file for complete search history.

(56) References Cited

U.S. PATENT DOCUMENTS

| 5,726,493 | A | | 3/1998 | Yamashita et al. | |
|---|---|---|---|---|---|
| 5,828,126 | A | * | 10/1998 | Thomas | ....................... 257/695 |
| 6,392,304 | B1 | * | 5/2002 | Butler | ......................... 257/777 |
| 6,469,374 | B1 | * | 10/2002 | Imoto | .......................... 257/686 |
| 6,590,291 | B2 | * | 7/2003 | Akagawa | ..................... 257/774 |
| 6,603,198 | B2 | * | 8/2003 | Akram et al. | ................ 257/686 |

FOREIGN PATENT DOCUMENTS

| JP | 64-050551 | 2/1989 |
|---|---|---|
| JP | 7-335783 | 12/1995 |
| JP | 8-222690 | 8/1996 |
| JP | 11-168150 | 6/1999 |
| JP | 2002-170906 | 6/2002 |

OTHER PUBLICATIONS

Japanese Office Action mailed Jun. 13, 2006, with partial translation.
Japanese Office Action mailed Jun. 13, 2006, with partial translation.

* cited by examiner

*Primary Examiner*—Long Pham
*Assistant Examiner*—Wai-Sing Louie
(74) *Attorney, Agent, or Firm*—Katten Muchin Rosenman LLP

(57) ABSTRACT

A ball grid array packaged semiconductor device mounted on a mounting board and including pads formed within a package and are connected to signal lines of a bare chip by bonding wires. There are formed first vias extending from the respective pads to a bottom surface of a package, and second vias extending from the same respective pads to a top surface of the package to form continuous vias. This makes it possible to connect the mounting boards to the top and bottom surfaces of the package, thereby enabling reduction of the wiring density of wiring patterns on the mounting boards, and thereby facilitating routing of the wiring patterns on the mounting boards. The semiconductor device is capable of reducing wiring density of the wiring pattern on the mounting board.

4 Claims, 16 Drawing Sheets

US 7,224,054 B2

SEMICONDUCTOR DEVICE AND SYSTEM HAVING SEMICONDUCTOR DEVICE MOUNTED THEREON

BACKGROUND OF THE INVENTION (1) Field of the Invention

This invention relates to a semiconductor device and a system having the semiconductor device mounted thereon, and more particularly to a ball grid array packaged semiconductor device and a system having the ball grid array packaged semiconductor device mounted thereon.

(2) Description of the Related Art

These days, with the progress of higher integration of elements into semiconductor devices, each semiconductor device has an increasing number of connection pins for connection to a mounting board. Further, to reduce the area of the semiconductor device, a narrower pin pitch is employed.

Packages of semiconductor devices include a QFP (Quad Flat Package), an SQFP (Shrink Quad Flat Package), and so forth. However, these packages are limited in their capability of coping with increase in the number of connection pins and reduction in the area of the semiconductor device. To overcome the problem, recently, attention has come to be paid to a BGA (Ball Grid Array) package allowing a large number of connection pins to be arranged thereon.

A BGA packaged semiconductor device includes connection pins (pads) on the underside of the package. FIG. 16 is a cross-sectional view of a conventional BGA packaged semiconductor device. The figure shows the semiconductor device 100, and a mounting board 110 on which the semiconductor device 100 is mounted. The semiconductor device 100 is mounted on the mounting board 110 by solder balls 111.

The semiconductor device 100 is comprised of the package 101, an inner board 102 fixed to an inner wall of the package 101 toward the mounting board 110, cylindrical vias 103 extending through the inner board 102 to the underside of the package 101, a bare chip 104 fixed to the inner wall of the package 101 toward the mounting board 110, and bonding wires 105 connecting the bare chip 104 and the vias 103 to each other.

Each via 103 has a pad 103a formed at one end thereof on the side of the inner board 102 for connection to one of the bonding wires 105, and a pad 103b formed at the other end thereof on the side of the mounting board 110 for connection to the wiring pattern on the mounting board 110 via one of the solder balls 111. The bare chip 104 have pads 104a for connection to the bonding wires 105.

Signal lines routed on the top of or inside the bare chip 104 are connected to the respective pads 104a to allow connection thereto. The pads 104a and the pads 103a of the vias 103 are connected by the bonding wires 105. The pads 103b of the vias 103 are connected to the wiring pattern on the mounting board 110 via the solder balls 111. Thus, the semiconductor device 100 has its signal lines provided with respective conductive extensions leading only to the underside of the package 101 toward the mounting board 110.

Incidentally, some BGA packaged semiconductor devices have 800 connection pins (pads 103b of the vias 103 in FIG. 16), and further some have a pin pitch of 0.8 mm. A semiconductor device of this kind with a large number of connection pins is mounted on a build-up board or a multi-layer board comprised of a lot of layers.

However, the semiconductor device is further making a progress toward still higher integration of elements therein, resulting in an even larger number of connection pins provided thereon. This increases the wiring density of a wiring pattern on a mounting board, which makes the wiring pattern difficult to be routed.

SUMMARY OF THE INVENTION

The present invention has been made in view of the above circumstances, and an object thereof is to provide a semiconductor device which makes it possible to reduce wiring density of a wiring pattern on a mounting board, thereby facilitating routing of the wiring pattern.

To attain the above object, there is provided a ball grid array packaged semiconductor device. This semiconductor device is characterized by comprising pads fixed within a package and connected to signal lines of a bare chip, and vias extending from associated ones of the pads to a bottom surface and a top surface of the package.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

The invention will now be described in detail with reference to the drawings showing a preferred embodiment thereof.

Figure 1:
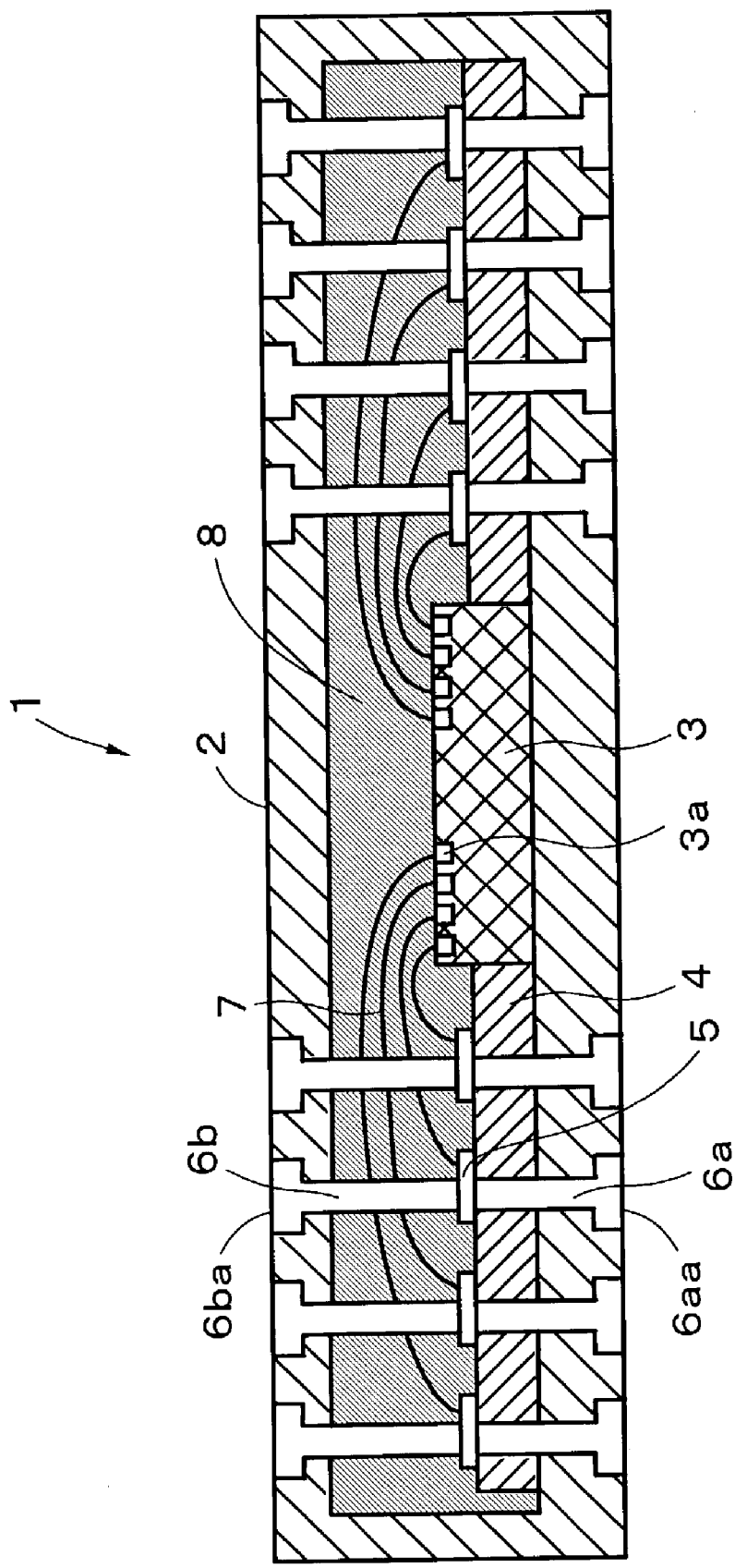
FIG. 1 is a longitudinal sectional view of a semiconductor device according to a first embodiment of the present invention.

FIG. 1 is a longitudinal sectional view of a semiconductor device according to a first embodiment of the present invention. The semiconductor device shown in FIG. 1 is comprised of a package 2, a bare chip 3 fixed to a central portion of an inner bottom surface of the package 2, an inner board 4 fixed to the inner bottom surface of the package 2 in a state fitted to the periphery of the bare chip 3, pads 5 fixed to an upper surface of the inner board 4 and connected to signal lines of the bare chip 3, respectively, vias 6a extending from the respective pads 5 to an outer bottom surface of the package 2, vias 6b extending from the respective pads 5 to an outer top surface of the package 2, bonding wires 7 for connecting the bare chip 3 and the pads 5, and a mold 8 filled within the package 2.

The bare chip 3 has pads 3a formed on a top surface thereof for connection to the respective bonding wires 7. The signal lines routed on the top of or inside the bare chip 3 are connected to the pads 3a, respectively, to allow connection thereto. The pads 3a on the top surface of the bare chip 3 and the pads 5 are connected by the bonding wires 7, respectively.

The vias 6a, 6b have cylindrical via pads 6aa, 6ba on the outer bottom surface and the outer top surface of the package 2, respectively, for connection to respective wiring patterns on mounting boards via solder balls.

As described above, each pad 5 connected to the signal line of the bare chip 3, and the respective vias 6a, 6b extending from the pad 5 to the outer bottom surface and outer top surface of the package 2 are arranged such that each signal line of the bare chip 3 is provided with respective conductive extensions leading to the outer bottom surface and outer top surface of the package 2. This makes it possible to connect the mounting boards to the top and bottom surfaces of the package 2 to reduce wiring density of the wiring pattern on each mounting board, thereby facilitating routing of the wiring pattern.

Further, the reduction of the wiring density reduces the number of via holes in each mounting board, which makes it possible to increase the number of semiconductor devices to be mounted.

It should be noted that pads for connection to the bonding wires 7 may be arranged on the inner board 4 around the bare chip 3, with a wiring pattern formed in an inner layer within the inner board 4, for connection between these pads and the pads 5. This also makes it possible to electrically connect the signal lines of the bare chip 3 and the pads 5, thereby providing the signal lines of the bare chip 3 with conductive extensions leading to the outer top surface and outer bottom surface of the package 2.

Next, a method of manufacturing the semiconductor device will be described hereafter.

Figure 2:
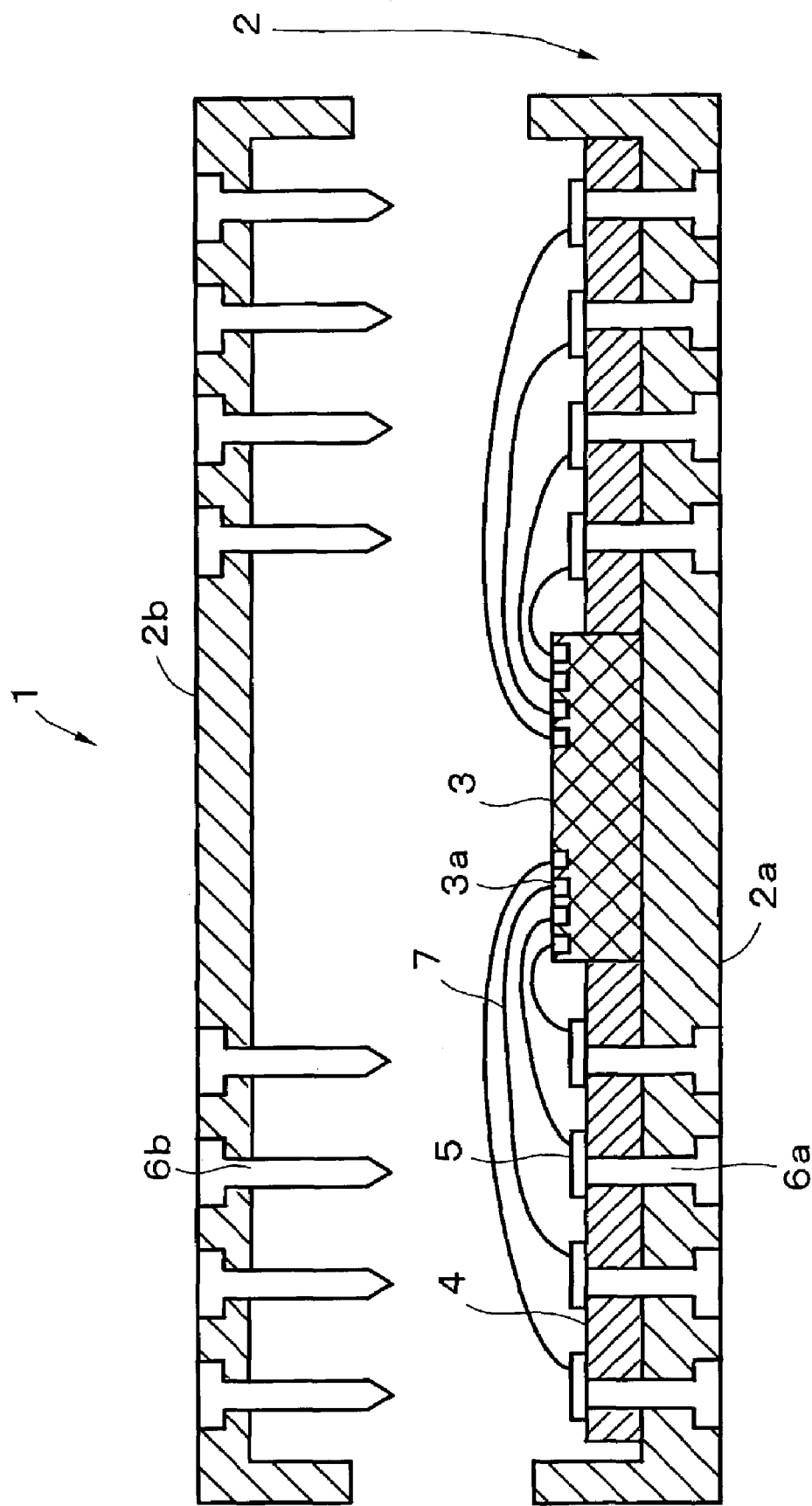
FIG. 2 is an exploded view of the semiconductor device.

FIG. 2 is an exploded view of the semiconductor device. As shown in the figure, the package 2 of the semiconductor device 1 is divided into a lower package 2a and an upper package 2b. The package 2 is formed of a ceramic material.

The lower package 2a and the inner board 4 are formed with holes that allow the vias 6a to be fitted therein. The vias 6a are fitted into the holes formed through the lower package 2a and the inner board 4 from an outer bottom surface of the lower package 2a. The length of each via 6a is configured to be equal to the thickness of the lower package 2a and the inner board 4 measured from the outer bottom surface of the lower package 2a to the upper surface of the inner board 4.

Each pad 5 is formed by molding with a resist or the like, at a portion of the inner board 4 where the via 6a is driven. The pad 5 and a corresponding one of pads 3a on the top surface of the bare chip 3 are connected by the bonding wire 7. It should be noted that the inner board 4 is made of glass epoxy or the like.

Each via 6b is integrally formed with the upper package 2b by molding when the upper package 2b is molded. The vias 6a, 6b, and the pads 5 are made of copper, for instance. The pads 5 are plated with gold.

Figure 3:
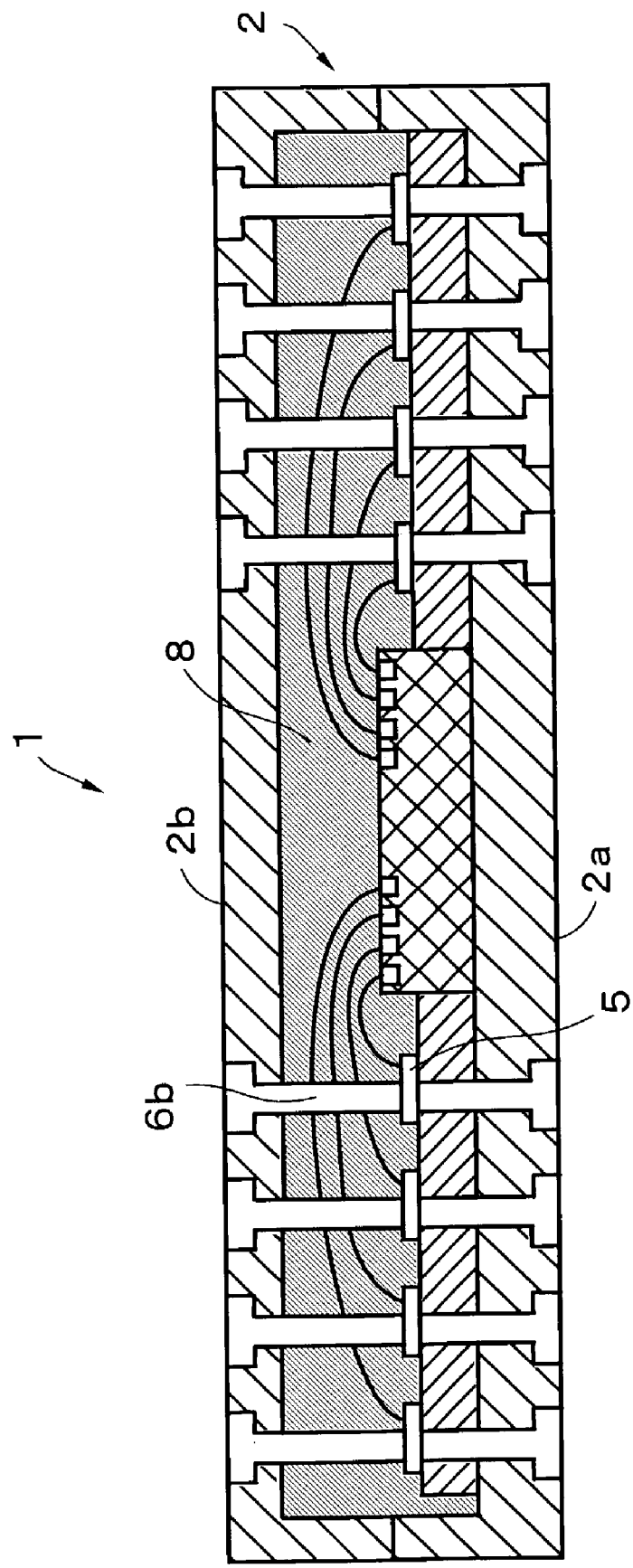
FIG. 3 is a view of the FIG. 2 semiconductor device after being assembled.

The lower package 2a and the upper package 2b are joined to each other. FIG. 3 shows an assembled state of the FIG. 2 semiconductor device. When the lower package 2a and the upper package 2b are joined to each other, the via 6b has a length which is large enough for a tip of the via 6b to reach the pad 5 and at the same time not so long as to be broken by the joining. In short, the via 6b is brought into pressure contact with the pad 5 by joining of the lower package 2a and the upper package 2b.

Further, when the lower package 2a and the upper package 2b are joined to each other, the mold 8 is injected therebetween to seal the inside of the package 2. As the material of the mold 8, there is used aluminum silicon, aluminum nitride ceramics or the like.

It should be noted that to seal the inside of the package 2, a hermetic sealing method is employed which hermetically seals the inside of the package 2 from the outside thereof to prevent intrusion of even a very small amount of gases or moisture. The hermetic sealing method is classified into metal sealing, ceramic sealing, solder sealing, etc. according to the material used. Further, a non-hermetic sealing method can be employed which is typified by a transfer mold method low in cost and excellent in mass productivity, though incapable of providing such high hermeticity as the hermetic sealing method.

As described above, it is possible to manufacture the semiconductor device in which the upper package 2b integrally formed with the vias 6b are joined to the lower package 2a having the vias 6a driven therein such that the vias 6b are brought into pressure contact with the pads 5, thereby providing the signal lines of the bare chip 3 with conductive extensions leading to the outer top surface and outer bottom surface of the package 2.

Figure 4:
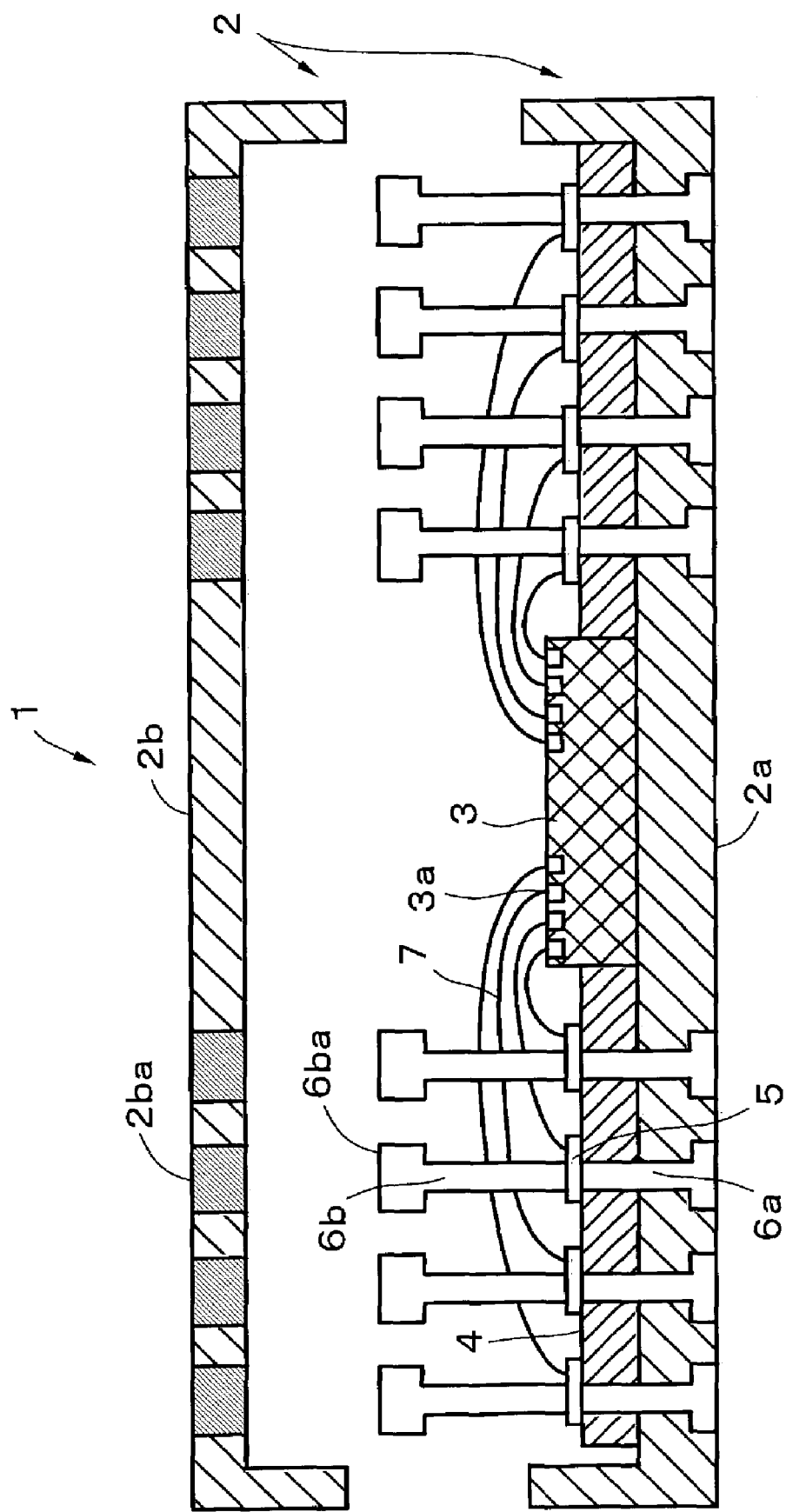
FIG. 4 is an exploded view (second one) of a semiconductor device.

It is also possible to manufacture the semiconductor device by forming the vias 6a, 6b in the lower package 2a and then joining the upper package 2b to the lower package 2a. FIG. 4 is an exploded view (second one) of the semiconductor device. As shown in the figure, the package 2 of the semiconductor device 1 is divided into a lower package 2a and an upper package 2b, both of which are formed of a ceramic material.

Similarly to the case described above with reference to FIG. 2, the lower package 2a and an inner board 4 are formed with holes into which vias 6a are driven to be fixed therein. Pads 5 to be brought into pressure contact with respective vias 6b are formed by molding with a resist or the like, at portions of the inner board 4 where the vias 6a are driven. Each pad 5 and a corresponding one of pads 3a on a top surface of a bare chip 3 are connected by a bonding wire 7. Each via 6b is joined to the pad 5. The via 6b is configured in advance to have such a length that the via 6b slightly protrudes from the outer top surface of the upper package 2b when the lower package 2a and the upper package 2b are joined to each other.

Figure 5:
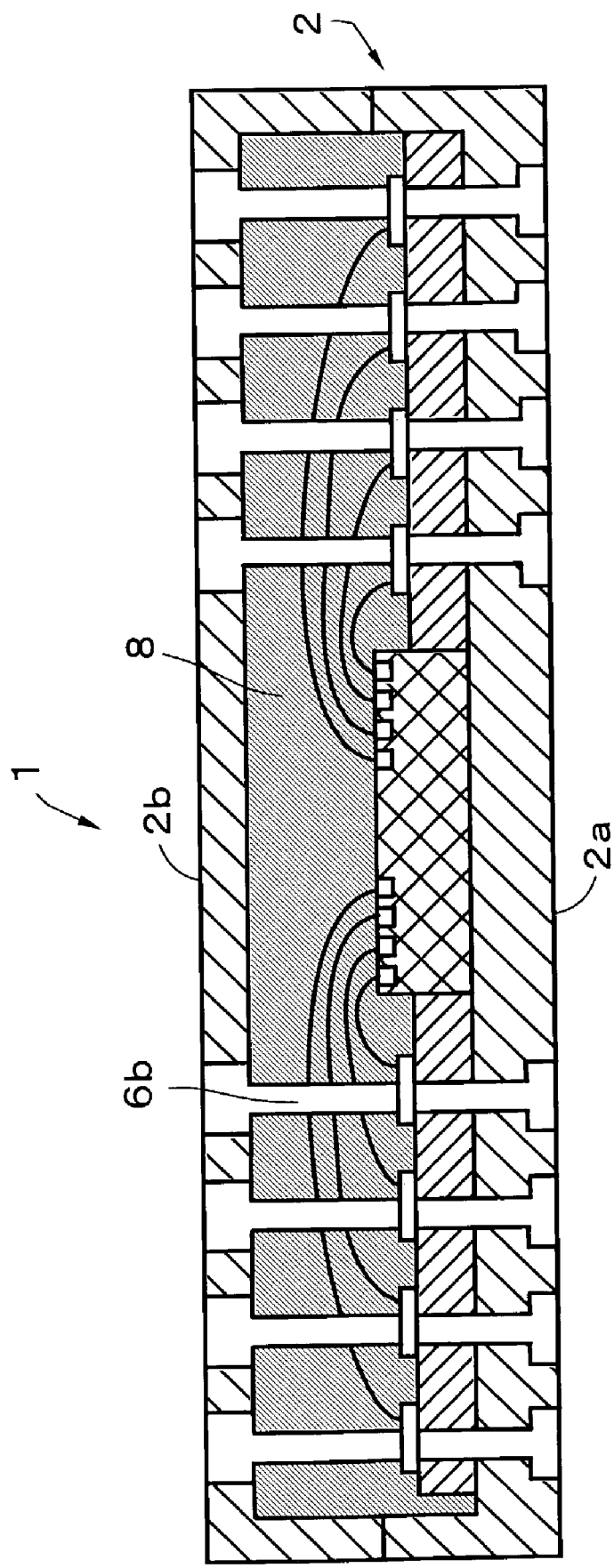
FIG. 5 is a view of the FIG. 4 semiconductor device after being assembled.

Formed through the upper package 2*b* are holes 2*ba* having the same shape as that of the pads 6*ba* of the vias 6*b*. The upper package 2*b* is joined to the lower package 2*a* such that the pads 6*ba* are fitted into the holes 2*ba* associated therewith, respectively. FIG. 5 shows an assembled state of semiconductor device shown in the FIG. 4. When the lower package 2*a* and the upper package 2*b* are joined to each other, a mold 8 is injected therebetween to seal the inside of the package 2. The material of the mold 8 and the sealing method of sealing the inside of the package 2 are the same as described hereinabove with reference to FIGS. 2 and 3, and hence detailed description thereof is omitted.

Respective portions of the vias 6*b* (pads 6*ba*) protruding from the upper package 2*b* are cut off such that the top surface of each via 6*b* is flush with the top surface of the upper package 2*b* (forming of via posts).

As described above, it is possible to manufacture the semiconductor device by fixing the vias 6*a*, 6*b* to the lower package 2*a*, and joining the upper package 2*b* formed with the holes 2*ba* having the same shape as that of the pads 6*ba* of the vias 6*b* so as to have them fitted therein, to the lower package 2*a*, such that the signal lines of the bare chip 3 are provided with respective conductive extensions leading to the outer top surface and outer bottom surface of the package 2.

Figure 6:
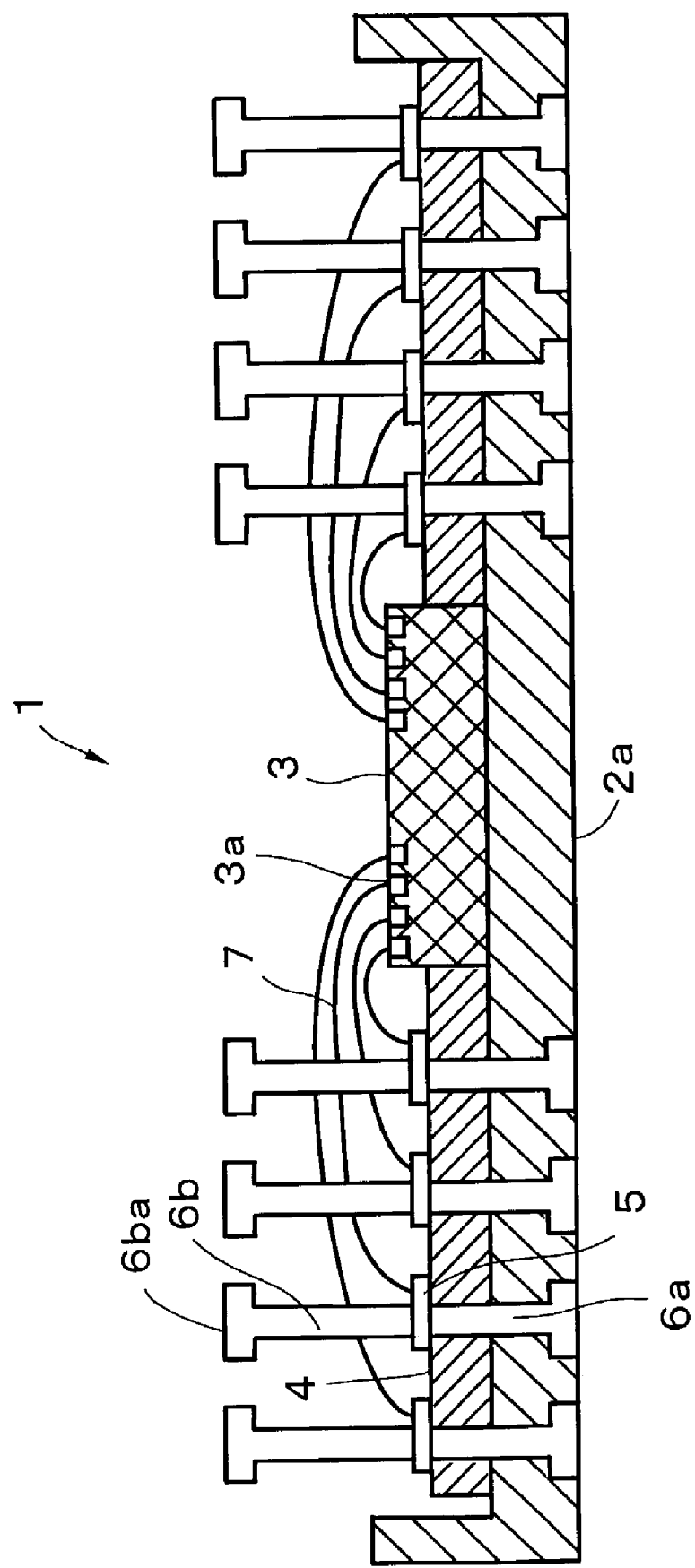
FIG. 6 is a view showing a semiconductor device before molding of an upper package.

Further, it is also possible to manufacture the semiconductor device by covering the lower package having the vias fixed thereto with a mold, and then performing a sintering or coagulating process. FIG. 6 shows the semiconductor device before molding of the upper package. Similarly to the case described above with reference to FIG. 2, in this semiconductor device 1, vias 6*a* are fixed to a lower package 2*a* and an inner board 4 and pads 5 are formed on the vias 6*a* by molding. Each pad 5 and a corresponding one of pads 3*a* on a top surface of a bare chip 3 are connected by a bonding wire 7. Each via 6*b* is joined to the top of the pad 5.

Figure 7:
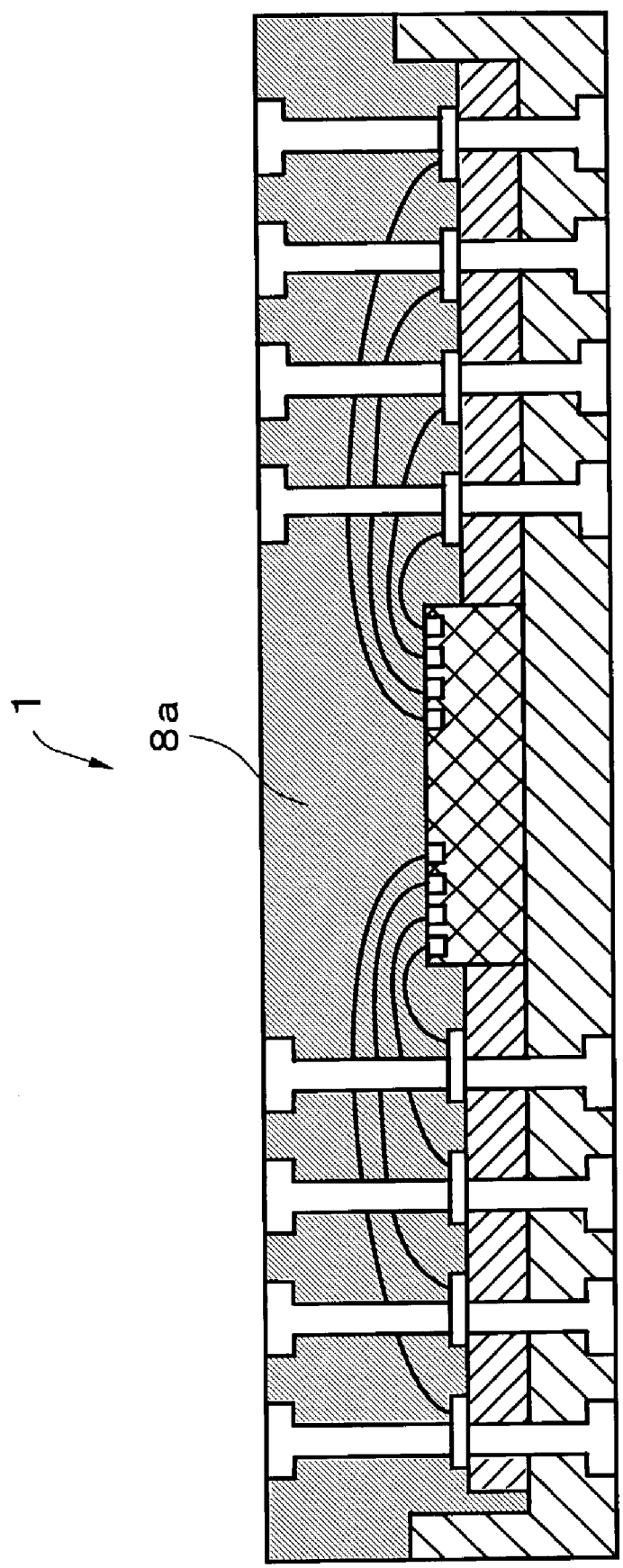
FIG. 7 is a diagram showing the semiconductor device after molding of the upper package.

The whole of the lower package 2*a* is covered with a mold, and the sintering or coagulating process is carried out. The lower package 2*a* is covered with the mold up to the height of the pads 6*ba* of the vias 6*b*. As the material of the mold for the sintering or coagulating process, there is used a synthetic material of aluminum and silicon carbide having high thermal conductivity and high thermal expansion, or a resin mold. FIG. 7 shows the semiconductor device after molding of the upper package. As shown in the figure, the mold 8*a* is formed into the upper package by the sintering or coagulating process.

As described above, it is possible to manufacture the semiconductor device by fixing the vias 6*a*, 6*b* to the lower package 2*a*, covering the whole lower package 2*a* with the mold 8*a*, and performing the sintering or coagulating process, such that the signal lines of the bare chip 3 are provided with respective conductive extensions leading to both the top and bottom surfaces of the package 2.

Next, mounting of the semiconductor device on the mounting board will be described hereinafter.

Figure 8:
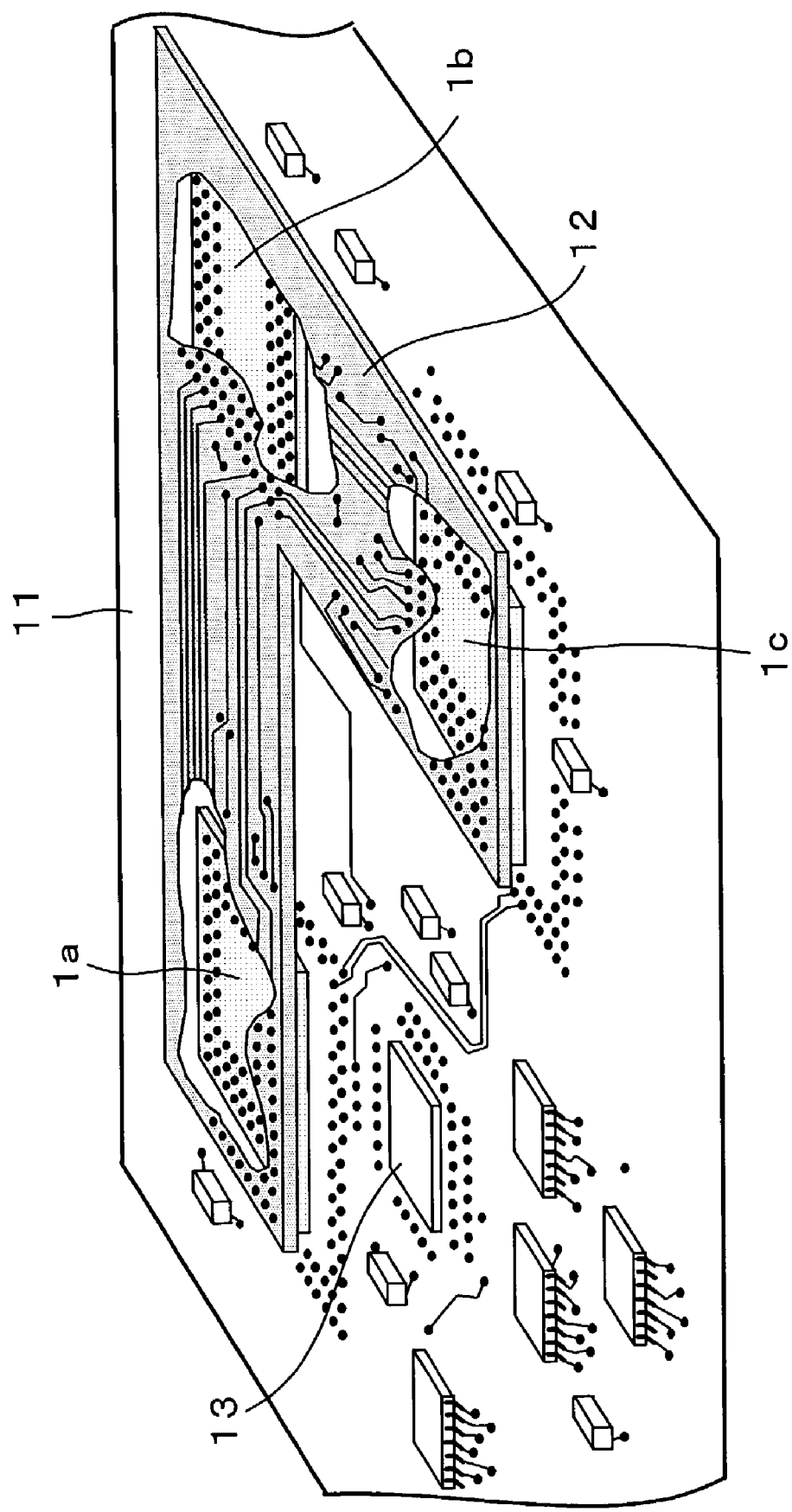
FIG. 8 is a perspective view of semiconductor devices and mounting boards.

FIG. 8 is a perspective view of semiconductor devices and mounting boards. The figure shows the semiconductor devices 1*a* to 1*c* according to the invention, a lower mounting board 11, an upper mounting board 12 (part of which is omitted), and a CPU (Central Processing Unit) 13. The semiconductor devices 1*a* to 1*c* are mounted on the lower mounting board 11 and the upper mounting board 12 via the top and bottom surfaces of their packages. Vias connected to the signal lines of the bare chips of the semiconductor devices 1*a* to 1*c* are connected to wiring patterns on the lower mounting board 11 and the upper mounting board 12 according to the kinds of signals. The CPU 13 is mounted on the lower mounting board 11.

Now, let it be assumed, for instance, that the semiconductor devices 1*a* to 1*c* are DSPs (Digital Signal Processors), that each DSP has a local bus for transmitting and receiving address signals, data, and control signals only between the DSPs, and a bus of a PCI interface for transmitting and receiving data between the same and the CPU 13, and that a memory, not shown in FIG. 8, according to the semiconductor device of the present invention, which is capable of inputting and outputting data via the top and bottom surfaces of the package, is mounted between the lower mounting board 11 and the upper mounting board 12. The package of the memory has pads formed on a top surface thereof, which are connected to the local buses of the DSPs, and pads formed on a bottom surface thereof for supplying electric power and reset signals. It should be noted that if a memory having pads only in the bottom surface of the package thereof is used, the memory may be mounted on the upper mounting board 12.

In the above case, the wiring pattern of the local buses are arranged on the upper mounting board 12, and the wiring pattern for the PCI interfaces are arranged on the lower mounting board 11. This makes it possible to physically separate the local buses of the DSPs and the PCI bus of the CPU 13 from each other by using the upper and lower mounting boards, thereby preventing cross-talk and noise from being caused by the buses. More specifically, the wiring patterns on the upper and lower mounting boards are made separate from each other according to the kinds of signals, and wired, whereby it is possible to prevent occurrence of cross-talk and noise at the wiring patterns.

It should be noted that the signal lines and power lines of the lower mounting board and the upper mounting board may be directly connected to each other by connectors or lead lines, neither of which is shown.

Figure 9:
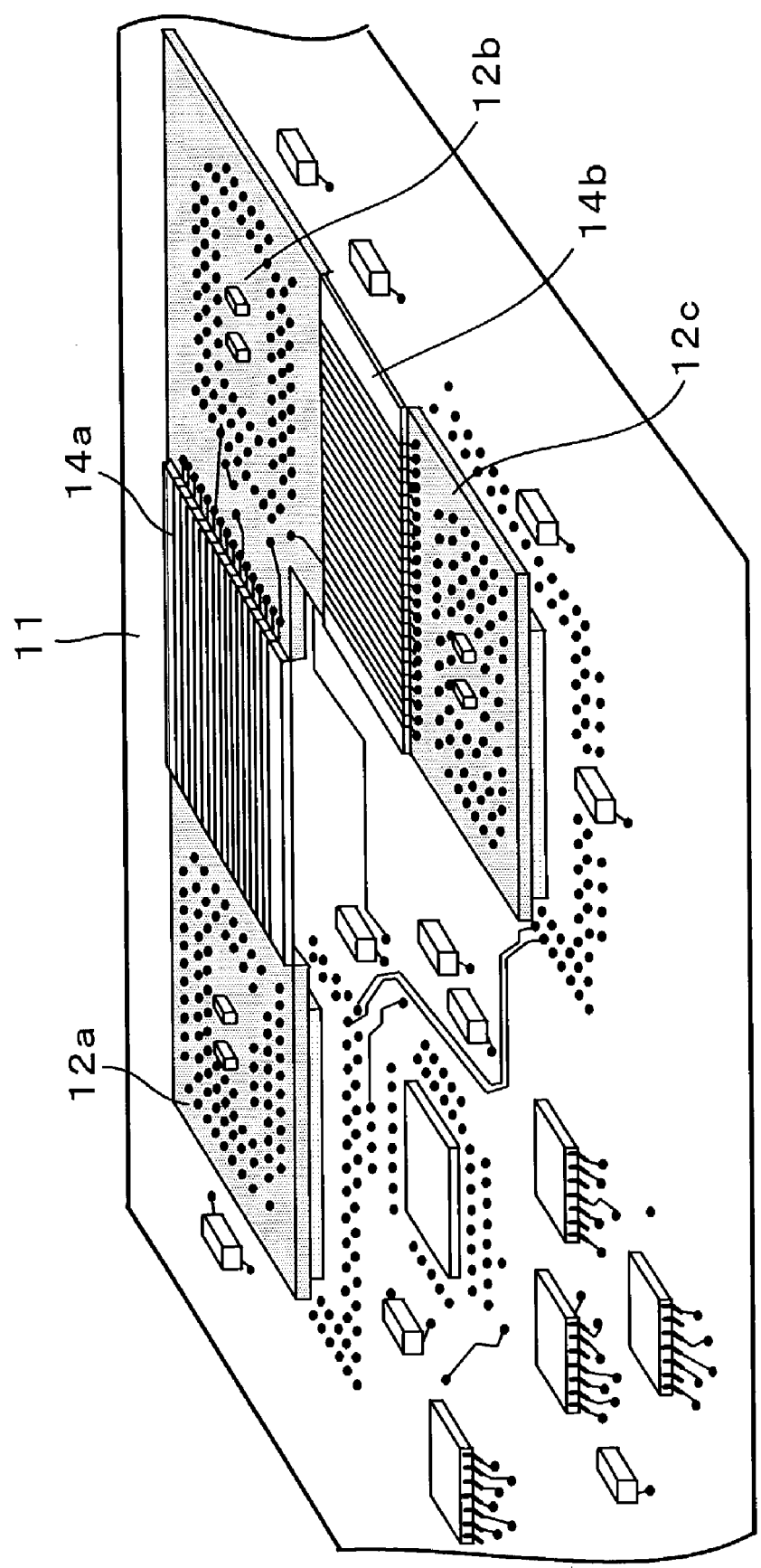
FIG. 9 is a perspective view of semiconductor devices, mounting boards, and flexible boards.

FIG. 9 is a perspective view of semiconductor devices, mounting boards, and flexible boards. The figure shows the lower mounting board 11, upper mounting boards 12*a* to 12*c*, and flexible boards 14*a*, 14*b*. The semiconductor devices, not shown, according to the present invention are mounted between the lower mounting board 11 and the upper mounting boards 12*a* to 12*c*. The flexible board 14*a* is connected to the upper mounting boards 12*a*, 12*b*. The flexible board 14*b* is connected to the upper mounting boards 12*b*, 12*c*.

As a result, for instance, even if the upper mounting boards 12*a* to 12*c* are deflected by a force applied thereto from an upward direction or a downward direction, the deflection is absorbed by the flexible boards 14*a*, 14*b*, thereby making it possible to prevent the upper mounting boards 12*a* to 12*c* from being cracked.

More specifically, by causing the upper mounting boards to have the semiconductor devices mounted thereon on a semiconductor device-by-semiconductor device basis, and the wiring patterns on the upper mounting boards to be connected by the flexible boards, it is possible to prevent breakage of the upper mounting boards.

Figure 10:
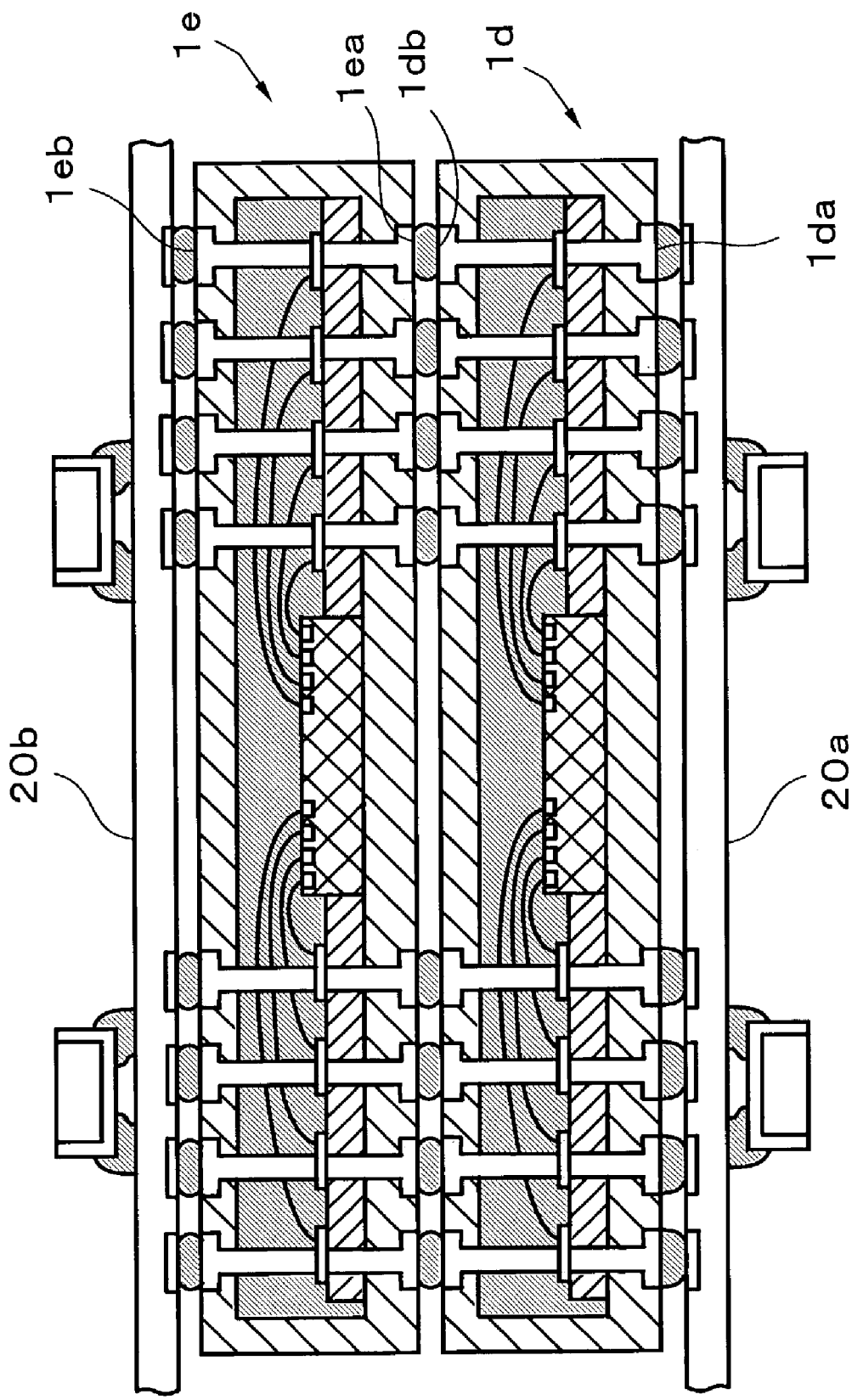
FIG. 10 is a cross-sectional view of semiconductor devices which are directly connected to each other and mounted on mounting boards.

It should be noted that the semiconductor devices may be mounted on the mounting boards in a state directly connected to each other. FIG. 10 is a cross-sectional view schematically showing the semiconductor devices which are mounted on the mounting boards in a state directly connected to each other. The figure shows a lower mounting board 20*a*, an upper mounting board 20*b*, and semiconductor devices 1*d*, 1*e* according to the present invention. Pads 1*da* arranged on the bottom surface of the package of the semiconductor device 1*d* and the wiring pattern on the lower mounting board 20*a* are connected to each other. Pads 1*db* arranged on the top surface of the package of the semiconductor device 1*d* and pads 1*ea* arranged on the bottom surface of the package of the semiconductor device 1*e* are connected to each other. Pads 1*eb* arranged on the top surface of the package of the semiconductor device 1*e* and the wiring pattern on the upper mounting board 20*b* are connected to each other.

Let it be assumed, for instance, that the semiconductor devices 1*d*, 1*e* have a master/slave relationship. In this case, the signal lines of a bare chip connected to the pads 1*da*, 1*db* in the semiconductor device 1*d*, and the signal lines of a bare chip connected to the pads 1*ea*, 1*eb* in the semiconductor device 1*e* can be arranged in the same manner, whereby data lines and address lines of the upper and lower semiconductor devices can be directly connected to each other.

As described hereinabove, the direct connection between the upper and lower semiconductor devices makes it possible to transmit and receive signals between the semiconductor devices without arranging dedicated wiring on the mounting boards. This makes it possible to reduce wring density of the wiring patterns on the mounting boards, thereby facilitating routing of the wiring patterns.

Figure 11:
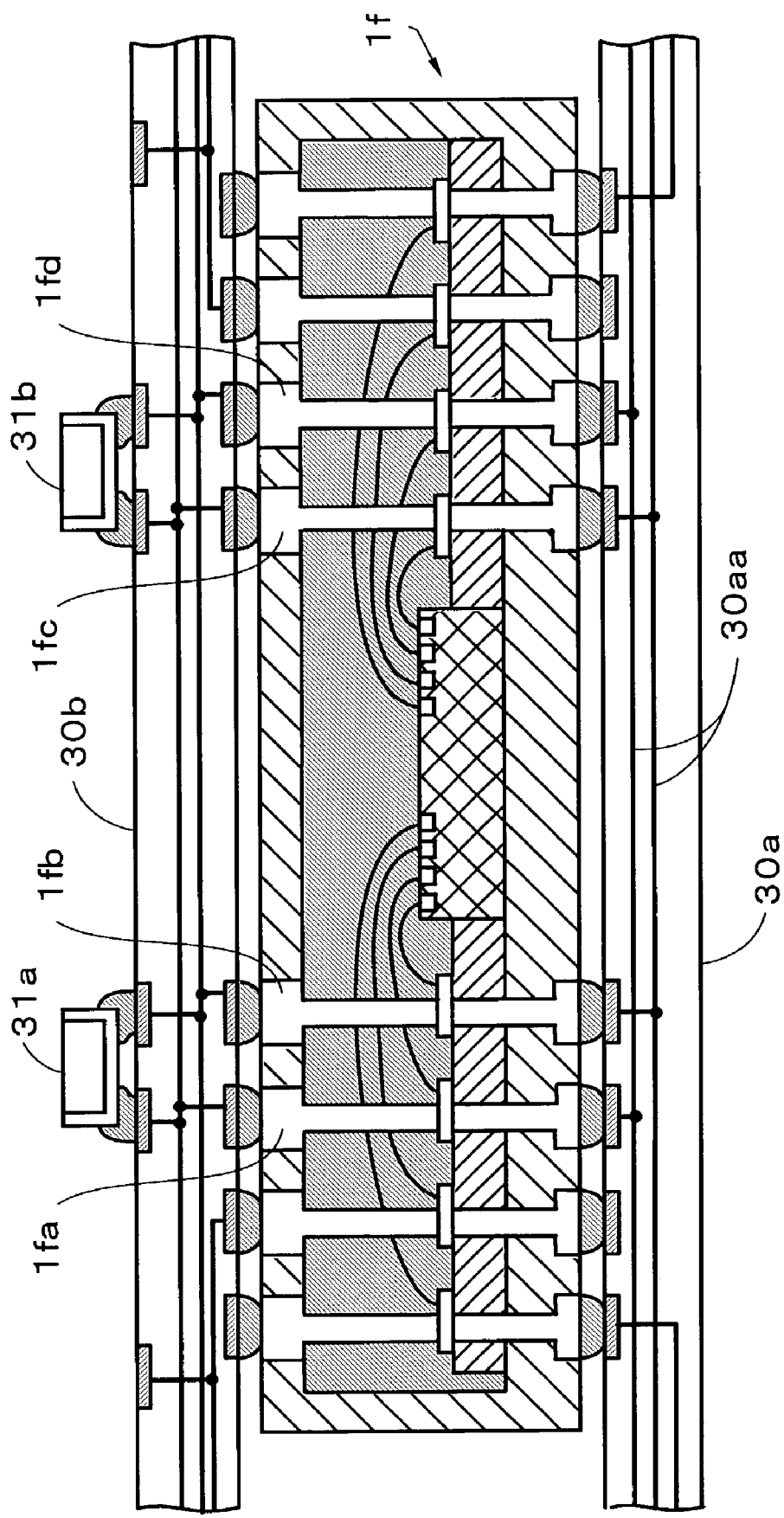
FIG. 11 is a cross-sectional view of a semiconductor device and bypass capacitors.

Next, the positional relationship between the semiconductor device and bypass capacitors will be described. The semiconductor device has bypass capacitors each connected between power terminals so as to prevent fluctuation of power supply and eliminate noise. In general, it is preferred that bypass capacitors are connected at locations close to the semiconductor device. FIG. 11 is a cross-sectional view of the semiconductor device and bypass capacitors. As shown in the figure, the semiconductor device 1*f* according to the present invention is mounted on a lower mounting board 30*a*, and an upper mounting board 30*b*. Vias 1*fa* to 1*fd* are for supplying the electric power.

The electric power is supplied from the wiring pattern 30*aa* of the lower mounting board 30*a* to the vias 1*fa*, 1*fb*, and the vias 1*fc*, 1*fd*. The vias 1*fa* to 1*fd* are also connected to the wiring pattern on the upper mounting board 30*b*, so that the bypass capacitors 31*a*, 31*b* can be mounted at locations close to the vias 1*fa* to 1*fd* of the upper mounting board 30*b*. This makes it possible to efficiently prevent fluctuation of power supply and eliminate noise.

Figure 12:
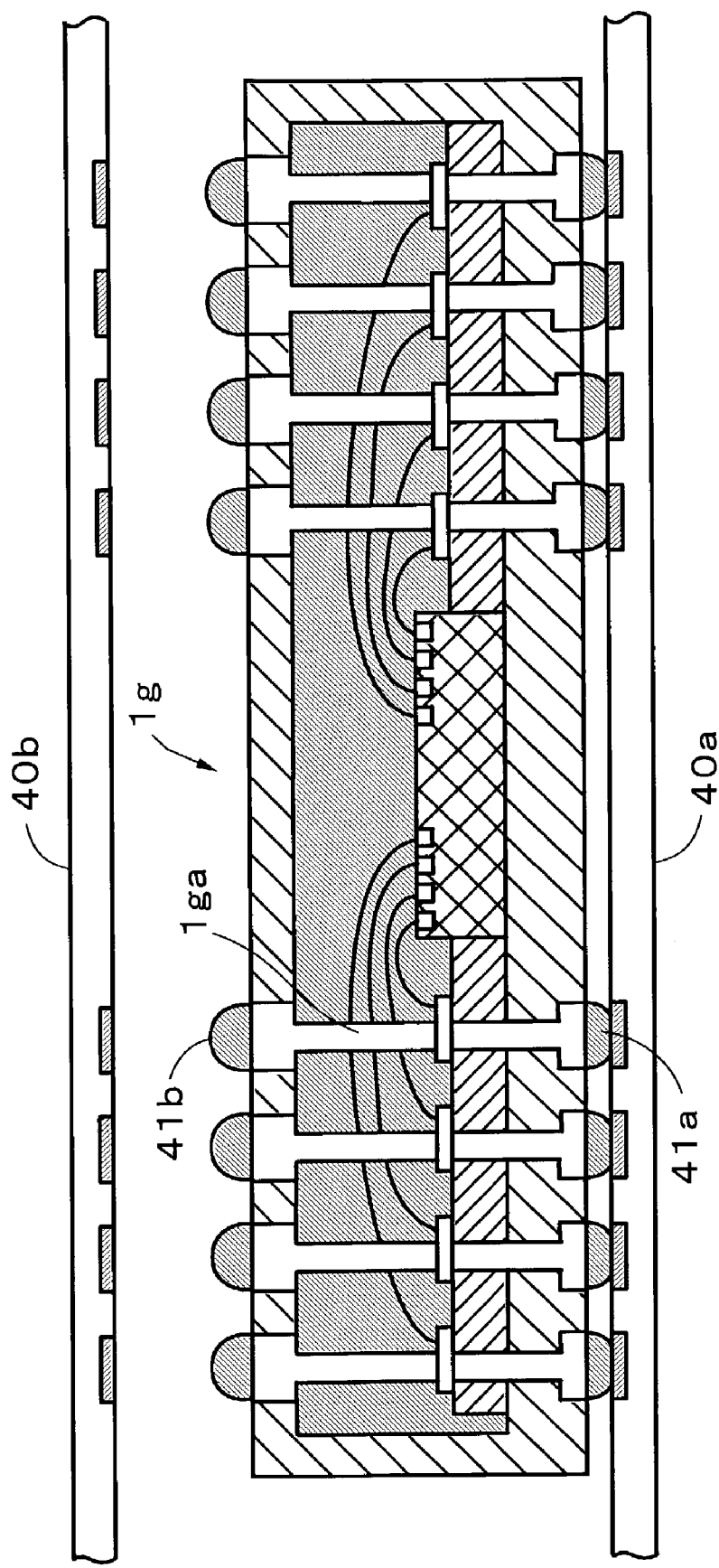
FIG. 12 is a view useful in explaining a method of mounting the semiconductor device.

Next, a method of mounting the semiconductor device on mounting boards will be described. FIG. 12 is a diagram useful in explaining the method of mounting the semiconductor device. The figure shows the semiconductor device 1*g* according to the present invention mounted on a lower mounting board 40*a*, and an upper mounting board 40*b*. The semiconductor device 1*g* has vias 1*ga* each having solder balls 41*a*, 41*b* attached thereto in advance. The solder balls 41*a* on the bottom surface of the package of the semiconductor device 1*g* are different from the solder balls 41*b* on the top surface of the same in melting temperature. Solder balls having a melting temperature lower than that of the solder balls 41*a* on the bottom surface of the package are used as the solder balls 41*b* on the top surface of the package. The lower mounting board 40*a* and the semiconductor device 1*g* are passed through a reflow oven to mount the semiconductor device 1*g* on the lower mounting board 40*a*.

The semiconductor device 1*g* mounted on the lower mounting board 40*a* and the upper mounting board 40*b* are passed through the reflow oven whose temperature has reached a temperature high enough to melt the solder balls 41*b*, to thereby mount the semiconductor device 1*g* on the upper mounting board 40*b*. At this time, since the melting temperature of the solder balls 41*b* mounted on the upper mounting board 40*b* is lower than that of the solder balls 41*a* mounted on the lower mounting board 40*a*, the lower solder balls 41*a* are not melted. Thus, the mounting boards are mounted on the top and bottom surfaces of the semiconductor device 1*g*.

Figure 13:
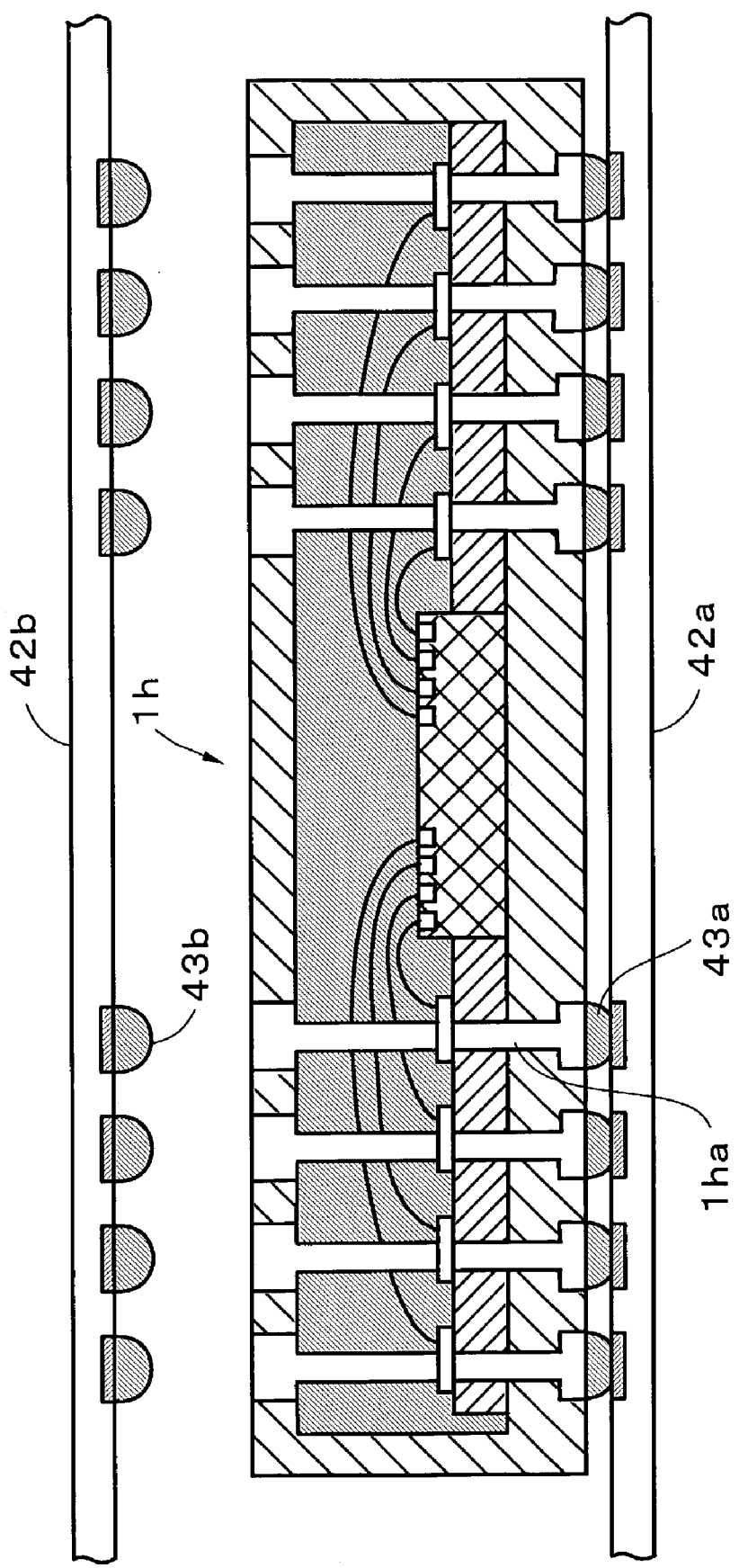
FIG. 13 is a view useful in explaining a method (second one) of mounting the semiconductor device.

FIG. 13 is a diagram useful in explaining a method (second one) of mounting the semiconductor device on mounting boards. The figure shows the semiconductor device 1*h* according to the present invention mounted on a lower mounting board 42*a*, and an upper mounting board 42*b*. First, solder balls 43*a* are attached in advance to pads of vias 1*ha* of the semiconductor device 1*h* toward the lower mounting board 42*a*, while pastes are attached in advance to pads of the vias 1*ha* toward the upper mounting board 42*b*. The lower mounting board 42*a* and the semiconductor device 1*h* are passed through the reflow, whereby the semiconductor device 1*h* is mounted on the lower mounting board 42*a*, as shown in FIG. 13.

The solder balls 43*b* are attached to lands of the upper mounting board 42*b*, which are to be connected to the vias 1*ha* of the semiconductor device 1*h*, respectively. Solder balls having a melting temperature lower than that of the solder balls 43*a* used for mounting the device on the lower mounting board 42*a* are used as the solder balls 43*b*. The semiconductor device 1*h* mounted on the lower mounting board 42*a* and the upper mounting board 42*b* are passed through the reflow whose temperature has reached a temperature high enough to melt the solder balls 43*b*, to thereby mount the semiconductor device 1*h* on the upper mounting board 42*b*. At this time, since the melting temperature of the solder balls 43*b* on the upper mounting board 42*b* is lower than that of the solder balls 43*a* on the lower mounting board 42*a*, the solder balls 43*a* are not melted. Thus, the mounting boards are mounted on the top and bottom surfaces of the semiconductor device 1*h*.

By configuring to attach the solder balls to the upper mounting board 42*b*, it is possible to avoid attachment of unnecessary solder balls to the top surface of the semiconductor device when the semiconductor device is not mounted on the upper mounting board.

Figure 14:
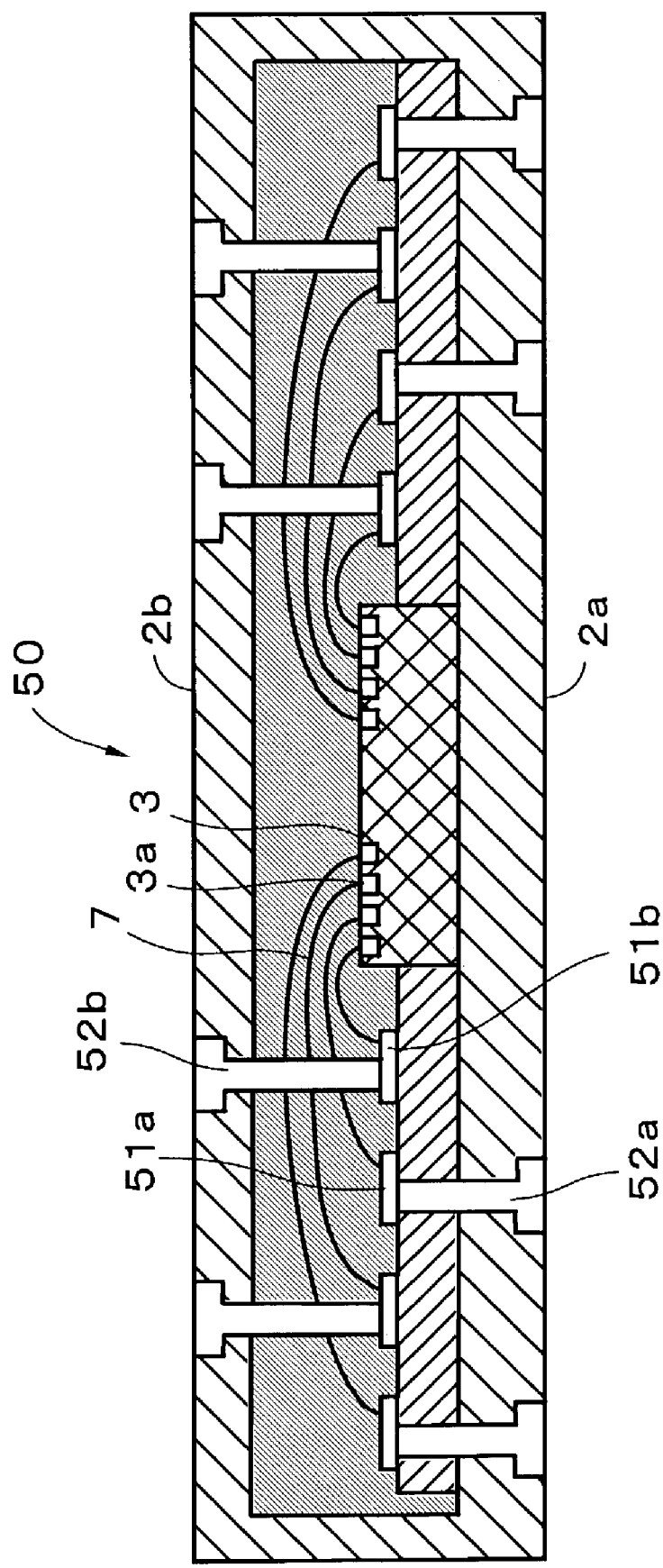
FIG. 14 is a longitudinal sectional view of a semiconductor device according to a second embodiment of the present invention.

Next, a second embodiment of the present invention will be described. FIG. 14 is a longitudinal sectional view of a semiconductor device according to the second embodiment of the present invention. The semiconductor device 50 shown in FIG. 14 is distinguished from that of the first embodiment in that vias, which have pads thereof connected to the signal lines of the bare chip, respectively, each extend from its pad only in the direction of the lower package or in the direction of the upper package. In the figure, component parts and elements similar to those shown in the FIG. 1 are designated by identical reference numerals, and detailed description thereof is omitted.

As shown in FIG. 14, the semiconductor device 50 includes pads 51*a*, 51*b* connected to the pads 3*a* of the bare chip 3 by the bonding wires 7, respectively, vias 52*a* extending from the pads 51*a* to the outer bottom surface of the lower package 2*a*, respectively, and vias 52*b* extending from the pads 51*a* to the outer top surface of the upper package 2*b*, respectively.

As described above, since the signal lines of the bare chip are provided with respective conductive extensions each leading either to the lower package 2*a* or to the upper package 2*b* alone, it is possible to reduce wring density of the wiring patterns on the mounting boards, thereby facilitating routing of the wiring patterns.

Figure 15:
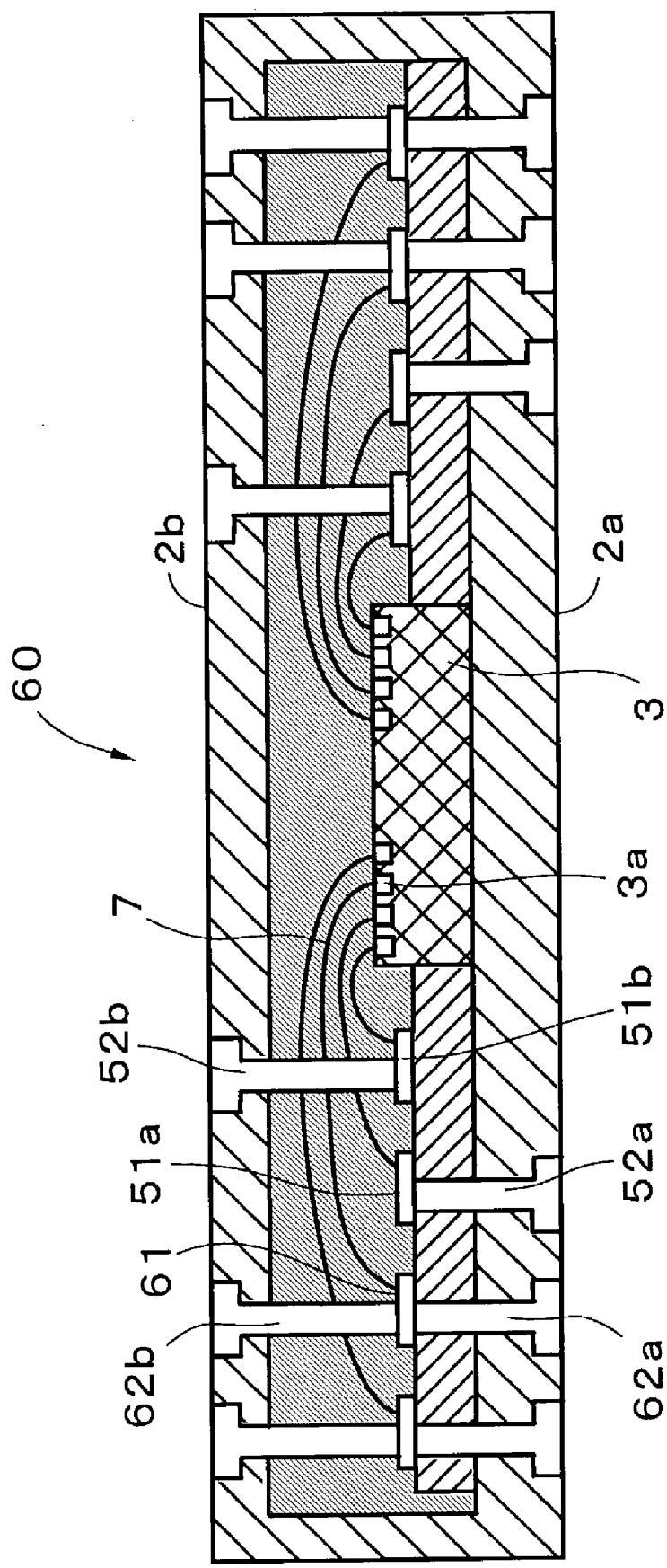
FIG. 15 is a longitudinal sectional view of a semiconductor device according to a third embodiment of the present invention.
Figure 16:
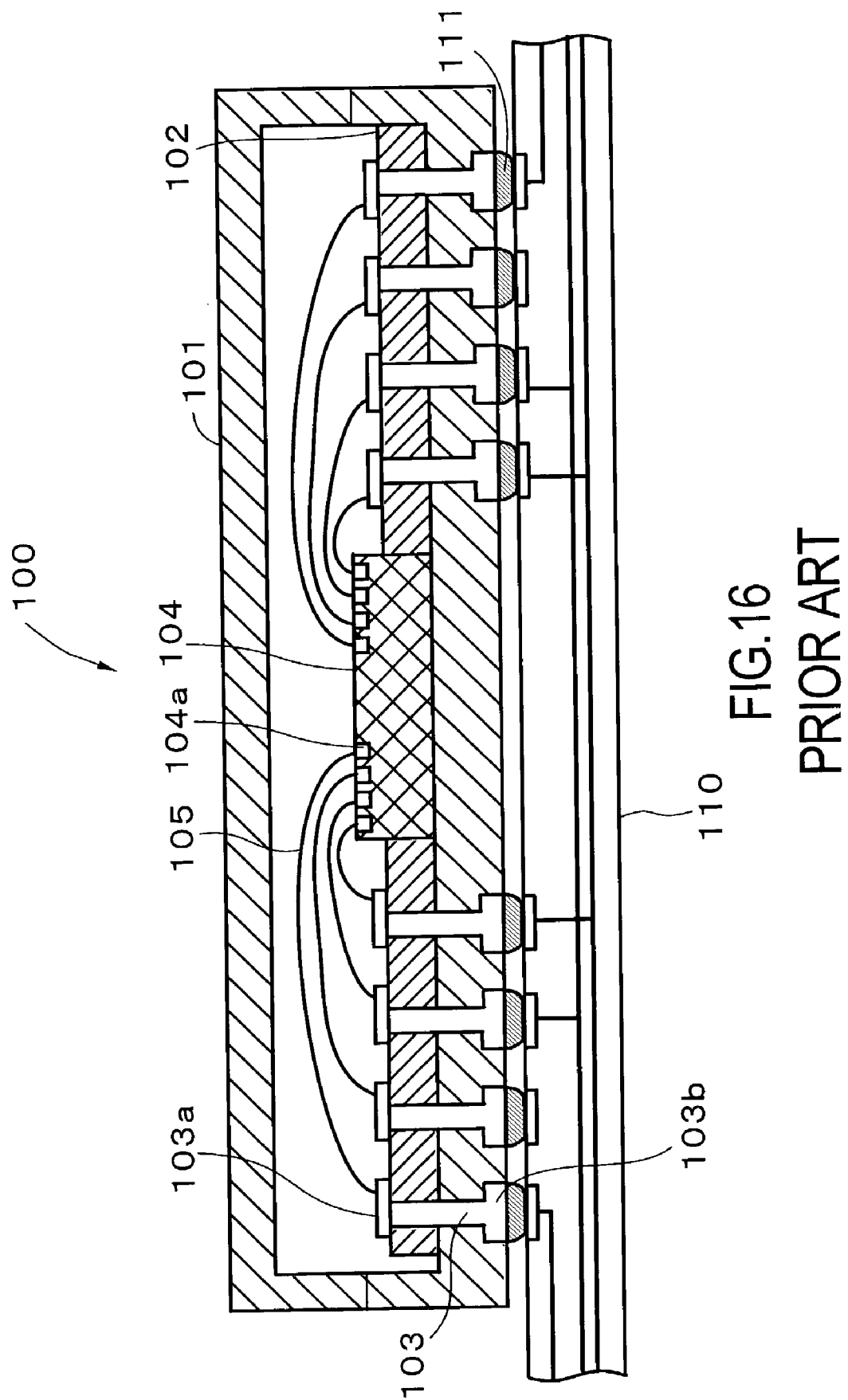
FIG. 16 is a cross-sectional view of a conventional BGA packaged semiconductor device.

Next, a third embodiment of the present invention will be described. FIG. 15 is a longitudinal sectional view of a semiconductor device according to the third embodiment of the present invention. The semiconductor device 60 shown in FIG. 15 is distinguished from that of the second embodiment in that vias, which have pads thereof connected to the signal lines of the bare chip, respectively, and each extend from its pad both in the direction of the lower package and in the direction of the upper package are mixed with vias of the FIG. 14 type each extending from its pad only in the direction of the lower package or in the direction of the upper package. In the figure, component parts and elements similar to those shown in the FIG. 14 are designated by identical reference numerals, and detailed description thereof is omitted.

As shown in FIG. 15, the semiconductor device 60 includes pads 61 connected to the pads 3a of the bare chip 3 by the bonding wires 7, respectively, vias 62a extending from their pads 61 to the outer bottom surface of the lower package 2a, and vias 62b extending from their pads 61 to the outer top surface of the upper package 2b. Further, the semiconductor device 60 includes vias 52a extending from their pads 51a through the lower package 2a, and vias 52b extending from their pads 51b to the upper package 2b.

As described above, by providing the vias 52a, 52b extending from their pads 51a, 51b connected to the signal lines of the bare chips 3 only to the lower package 2a and only to the upper package 2b, respectively, and the vias 62a, 62b extending from the their pads 61 both to the lower package 2a and the upper package 2b in a mixed manner, it possible to reduce wiring density of the wiring patterns on the lower and upper mounting boards, thereby facilitating routing of the wiring patterns on the boards.

As described hereinbefore, the semiconductor device according to the present invention is configured such that the vias extend from pads fixed within the package and connected to the signal lines of the bare chip to the bottom surface and top surface of the package. This enables the mounting boards to be connected to the top surface and bottom surface of the package, thereby making it possible to reduce wiring density of wiring patterns of the mounting boards, thereby facilitating routing of the wiring patterns on the mounting boards.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A system having a ball grid array packaged semiconductor device mounted thereon, comprising:
   a semiconductor device including pads fixed within a package and connected to signal lines of a bare chip, and first vias extending from associated ones of said pads to a bottom surface of the package and second vias extending from said pads to a top surface of the package;
   a first board connected to said vias on the bottom surface of each package;
   a second board connected to said vias on the top surface of said each package,
   said second vias overlaying said first vias and being connected to said, and
   wherein balls are formed on both the top surface and the bottom surface, wherein one of said first board and said second board has a wiring pattern for supplying electric power to said semiconductor device, and another of said first board and said second board has a bypass capacitor at a location close to said semiconductor device.

2. The system according to claim 1, wherein a wiring pattern on said first board and a wiring pattern on said second board are made separate according to kinds of signals transmitted and received by said semiconductor device.

3. The system according to claim 1, wherein said second boards are connected to the top surface of the package of said semiconductor device, said second boards being connected to each other by a flexible board.

4. A system having a ball grid array packaged semiconductor device mounted thereon, comprising:
   a semiconductor device including pads fixed within a package and connected to signal lines of a bare chip, and first vias extending from associated ones of said pads to a bottom surface of the package and second vias extending from said pads to a top surface of the package;
   a first board connected to said vias on the bottom surface of each package;
   a second board connected to said vias on the top surface of said each package;
   said second vias overlaying said first vias and being connected to said first vias, and
   said pads within the package being connected to said bare chip by wires,
   wherein one of said first board and said second board has a wiring pattern for supplying electric power to said semiconductor device, and another of said first board and said second board has a bypass capacitor at a location close to said semiconductor device.

* * * * *